(12) United States Patent
Xu et al.

(10) Patent No.: US 7,638,867 B2
(45) Date of Patent: Dec. 29, 2009

(54) MICROELECTRONIC PACKAGE HAVING SOLDER-FILLED THROUGH-VIAS

(75) Inventors: Dingying Xu, Chandler, AZ (US); Dale A. Hackitt, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 108 days.

(21) Appl. No.: 11/446,305

(22) Filed: Jun. 2, 2006

(65) Prior Publication Data

US 2007/0278635 A1    Dec. 6, 2007

(51) Int. Cl.
*H01L 23/00* (2006.01)
*H01L 23/48* (2006.01)
*H01L 23/52* (2006.01)
*H01L 29/40* (2006.01)

(52) U.S. Cl. ........................ 257/686; 257/777; 257/778
(58) Field of Classification Search ......... 257/678–700, 257/E23.001, E23.021, E23.085, 774–794
See application file for complete search history.

(56) References Cited

U.S. PATENT DOCUMENTS

| | | | |
|---|---|---|---|
| 5,557,150 A | 9/1996 | Variot et al. | |
| 5,869,894 A | 2/1999 | Degani et al. | |
| 6,407,456 B1 * | 6/2002 | Ball | 257/777 |
| 6,731,189 B2 | 5/2004 | Puzella et al. | |
| 6,746,897 B2 | 6/2004 | Fukutomi et al. | |
| 6,812,549 B2 * | 11/2004 | Umetsu et al. | 257/621 |
| 6,828,512 B2 | 12/2004 | Chung et al. | |
| 6,933,613 B2 * | 8/2005 | Akashi | 257/778 |
| 6,998,709 B2 | 2/2006 | Khorram | |
| 2004/0113261 A1 * | 6/2004 | Sunohara et al. | 257/700 |

* cited by examiner

*Primary Examiner*—Cuong Q Nguyen
(74) *Attorney, Agent, or Firm*—Kathy Ortiz

(57) ABSTRACT

An apparatus, a method, and a system associated with microelectronic packaging are disclosed herein. In various embodiments, a microelectronic package may include a die having one or more through-vias, each filled with a solder material; a substrate; and one or more solder bumps disposed between and electrically connecting the substrate and a backside of the die.

14 Claims, 4 Drawing Sheets

MICROELECTRONIC PACKAGE HAVING SOLDER-FILLED THROUGH-VIAS

TECHNICAL FIELD

Embodiments of the invention relate generally to the field of integrated circuit design, specifically to methods, apparatuses, and systems associated with microelectronic device packaging.

BACKGROUND

Integrated circuit manufacturing typically includes various packaging processes. These packaging processes sometimes involve attaching a die to a substrate and in some of these processes, a substrate is coupled to a backside of a die having through-vias. For example, some packages will include one or more silicon backplane dice having a plurality of electrical ground through-silicon vias located on their backside surfaces. The backside surface of the silicon backplane die being generally coupled to a carrier substrate such as a copper leadframe or a bismaleimide-triazine substrate. In some packaging processes, in order to form such backside vias, typically a die with a via hole (or multiple via holes) disposed on the backside, is placed over an underlying substrate. Disposed on top of the underlying substrate typically is some epoxy-based/organic material-based conductive material, e.g., cure-induced die attach adhesive, conductive die attach paste, or conductive die attach adhesive. Attachment of the die to the underlying substrate generally is accomplished by pressing the die onto the conductive material on top of the underlying substrate. The intent for pressing the die on top of the conductive paste is to fill the via hole with the conductive paste, thus electrically coupling the die to the underlying substrate.

Unfortunately, by using the conventional process, any number of problems may result. For example, cure-induced die attach adhesive may shrink, causing cracking within the adhesive in the via and initiating delamination at leadframe interfaces, with cracking being exacerbated by thermal processing. Conductive die attach paste often is too brittle and lacks durability. Conductive die attach adhesive typically has a much higher coefficient of thermal expansion than do carrier substrates, die, and molding compounds, resulting in severe die warpage after die-attach curing. Furthermore, pressing the die onto an attachment material on an underlying substrate may result in an air pocket or air void at the top of the through silicon via resulting in a partially filled via hole. As a result of these problems, the reliability as well as the electrical and thermal performance of the resulting package may be compromised.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)." The phrase "(A) B" means "(B) or (A B)," that is, A is optional.

Figure 1:
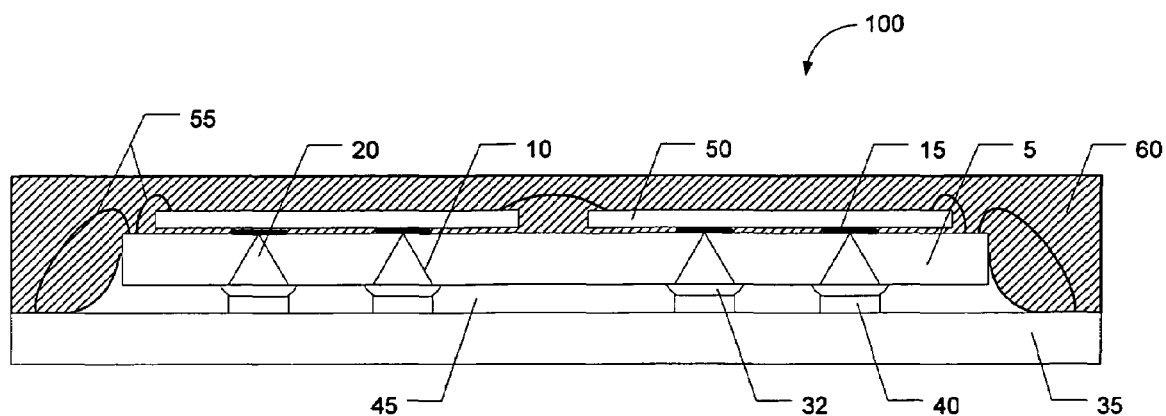
FIG. 1 illustrates a cross-section of a package according to one embodiment.

Referring now to FIG. 1, illustrated is a cross-section of an embodiment of a microelectronic package 100 in accordance with an embodiment. As shown, microelectronic package 100 may comprise die 5 having one or more through-vias 10, each filled with a solder material 20; substrate 35; and one or more solder bumps 32 disposed between and electrically connecting substrate 35 and backside of die 5. Microelectronic package 100 may comprise one or more microelectronic devices 50 disposed on frontside of die 5 and electrically coupled to solder material 20 of at least one of through-vias 10. A microelectronic device 50 may include a radio-frequency device, a logic device, and/or a memory device, depending on the application.

Die 5 may comprise one of various types of die and may comprise one or more through-vias 10. For example, die 5 may comprise a silicon die, a gallium arsenide die, a germanium die, or combinations thereof. One or more through-vias 10 may each be filled with a solder material 20. For example, solder material 20 may comprise one or more of various solder paste materials. Solder material 20 may comprise an all-metal or substantially all-metal alloy. One or more through-vias 10 may each be filled with solder material 20 using various techniques, including, for example, stencil printing. As needed and depending on the application, die 5 may comprise one or more conductive pads 15 disposed thereon and in electrical communication with one or more through-vias 10 to provide, for example, a desired electrical contact between through-vias 10 and microelectronic device 50.

Through-vias 10 may allow for a direct electrical ground path depending on the application. Additionally or alternatively, one or more through-vias 10 may allow for thermal dissipation generated by the die and/or a microelectronic device.

Furthermore, through-vias 10 may be pyramidal in shape as shown, having a larger end and tapered to a smaller end. In alternative embodiments, however, the through-vias 10 may have conical, cylindrical, or other shapes.

With respect to substrate 35, substrate 35 may be one of various types of substrates. For example, substrate 35 may be a carrier substrate such as a leadframe or bismaleimide-triazine substrate. Substrate 35 may have one or more electrical contact features depending on the application, including, for example, copper bumps 40.

As mentioned previously, microelectronic package 100 may comprise one or more solder bumps 32 disposed between and electrically connecting substrate 35 and a backside of die 5. In some embodiments, solder bumps 32 may be formed by placing a solder ball (see 25 of FIG. 4, discussed more fully below) on each of one or more through-vias 10 followed by a reflow process.

Microelectronic package 100 may comprise one or more microelectronic devices 50. Depending on the application, microelectronic device 50 may be one of various devices including, for example, a radio-frequency device, a logic device, and/or a memory device. Microelectronic device 50 may be disposed on a frontside of die 5 and electrically coupled to solder material 20 of at least one of through-vias 10. As mentioned previously, die 5 may comprise one or more conductive pads 15 and microelectronic device 50 may be disposed on and/or electrically coupled to the one or more conductive pads 15 disposed on die 5. Depending on the application, microelectronic device 50 may be wire-bonded 55 to die 5 and/or substrate 35.

Microelectronic package 100 may comprise an underfill material 45 disposed between die 5 and substrate 35. In these embodiments, various underfilling techniques may be enlisted to provide the underfill material between die 5 and substrate 35. For example, a capillary underfill process may be enlisted. In addition, any one or more of various underfill materials may be used including, for example, various epoxy-based underfill materials.

Microelectronic package 100 may be encapsulated. For example, a molding material 60 may encapsulate die 5 and microelectronic device 50. Depending on the application, microelectronic package 100 may be molded in part or in whole, and various techniques for molding including, for example, transfer molding, may be enlisted. Furthermore, various molding materials may be used including, for example, various epoxy-based molding materials.

Figure 2:
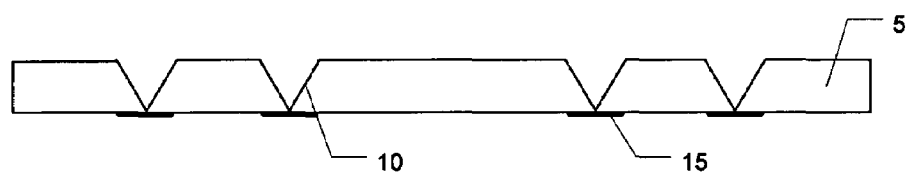
FIGS. 2-9 illustrate a method of packaging according to one embodiment.

Referring now to FIGS. 2-9, illustrated is an embodiment of a method for making a microelectronic package. As shown in the referenced figures, illustrated are cross-sectional views of various processing stages of a method embodiment. As shown in FIG. 2, a die 5 is provided. Die 5 may have one or more through-vias 10 and in some embodiments through-vias 10 may be formed by one or more of various processes including, for example, a wet etch process, a dry etch process, laser ablation, and/or similar processes. Die 5 may further comprise one or more conductive pads 15 disposed over or near through-vias 10.

Figure 3:
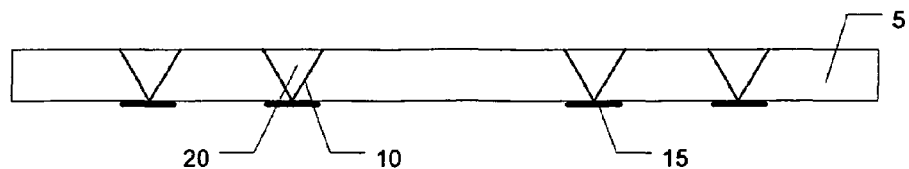

As shown in FIG. 3, through-vias 10 are each filled with a solder material 20. In some of these embodiments, solder material 20 may comprise a solder paste or similar solder materials. In these embodiments, solder paste may have a desired coefficient of thermal expansion (CTE) relative to other components of microelectronic package so that cracking and/or separation of components do not occur or are less likely to occur.

Figure 4:
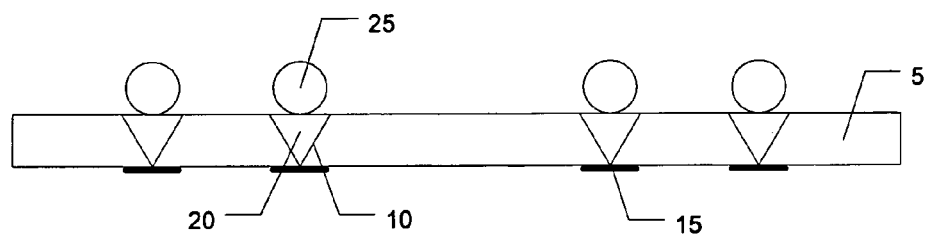
Figure 5:
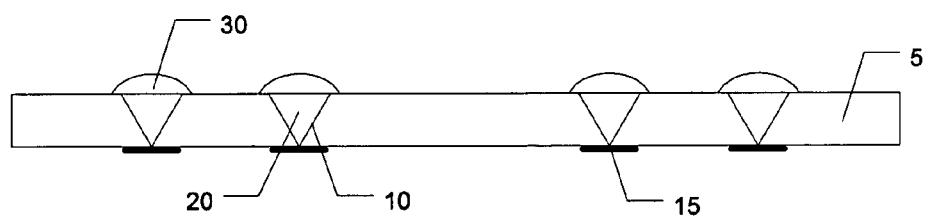

Turning now to FIG. 4, one or more solder balls 25 may be placed on die 5. Solder balls 25 may be placed as shown wherein a solder ball 25 is disposed directly over a through-via 10 filled with solder material 20. As shown in FIG. 5, solder balls 25 may then be melted or reflown to form one or more solder bumps 30. The reflow process may be one or more of various techniques including, for example, infrared reflow, laser reflow, etc. Depending on the application, reflow processes may be followed by a deflux process including, for example, rinsing to remove unwanted residues that may remain after reflowing.

Figure 6:
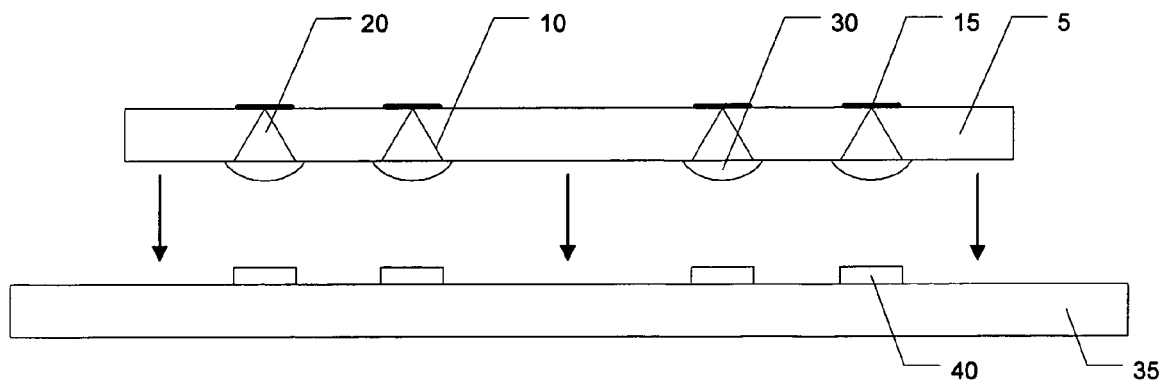
Figure 7:
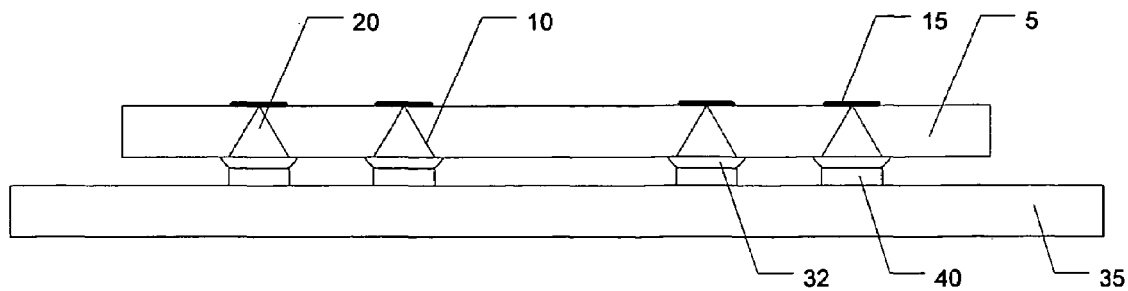

Die 5 may be joined to substrate 35 as shown in FIG. 6 and FIG. 7. One or more of solder bumps 30 disposed on die 5 may be joined to substrate 35. With respect to substrate 35, substrate 35 may have one or more copper bumps 40 disposed thereon and in these embodiments, solder bumps 30 of die 5 may be joined to copper bumps 40 of substrate 35. Depending on the application, solder bumps 30 of die 5 may be joined directly to substrate 35. Joining of solder bumps 30 to substrate 35 (or to copper bumps 40 of substrate 35) may be effectuated by any one or more of various techniques including, for example, reflow processes.

Figure 8:
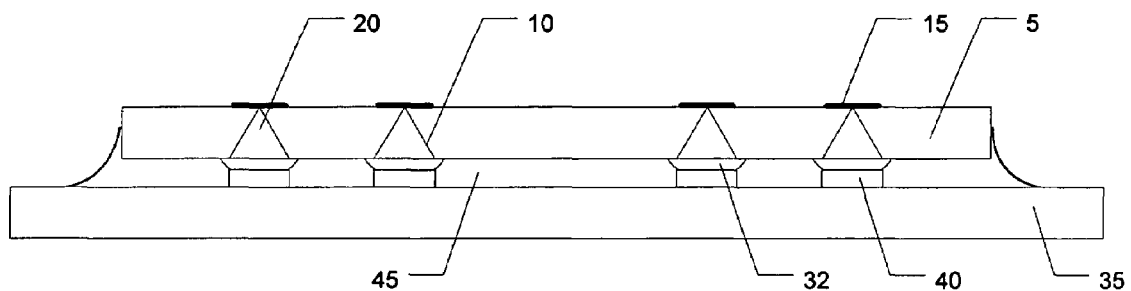

Underfill 45 may be provided between die 5 and substrate 35 as shown in FIG. 8. Underfill 45 may offer additional structural support and/or reduction of warpage of microelectronic package during thermal cycling. With respect to the process of underfilling, a capillary process may be enlisted in various embodiments. With respect to materials appropriate for underfilling, any material providing the desired structural, CTE, etc., characteristics may be used, including, for example, epoxy-based materials.

Figure 9:
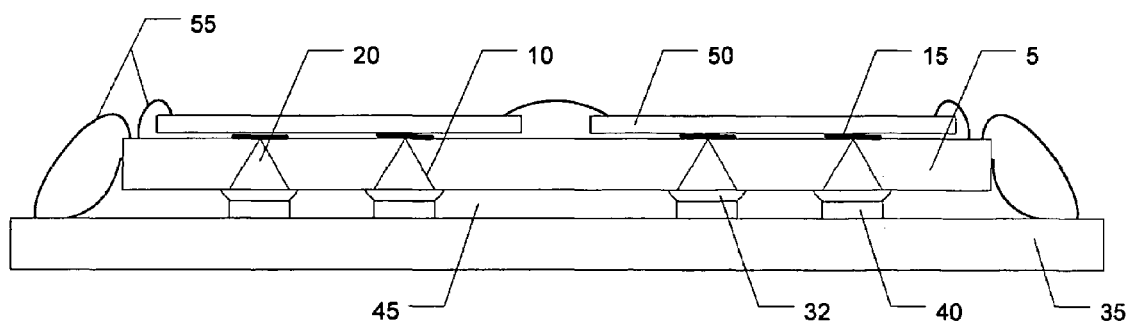

Referring now to FIG. 9, one or more microelectronic devices 50 may be coupled to die 5. As mentioned previously, depending on the application, microelectronic device 50 may be one of various devices including, for example, a radio-frequency device, a logic device, or a memory device. In various ones of these embodiments, microelectronic device 50 may be coupled to one or more conductive pads 15 disposed on die 5. Further, microelectronic device 50 may have electrical contact with die 5 and substrate 35, via solder bump 30, to provide an electrical ground for microelectronic package. Microelectronic package may be wire-bonded 55 to make the microelectronic package electrically functional, depending on the application.

Referring again to FIG. 1, illustrated is a cross-section of a microelectronic package 100. In these embodiments, die 5 and microelectronic device 50 may be encapsulated in a molding material 60. Various molding materials may be used including, for example, epoxy-based molding materials, although other molding materials may be used within the scope of various embodiments in accordance with the present invention.

Figure 10:
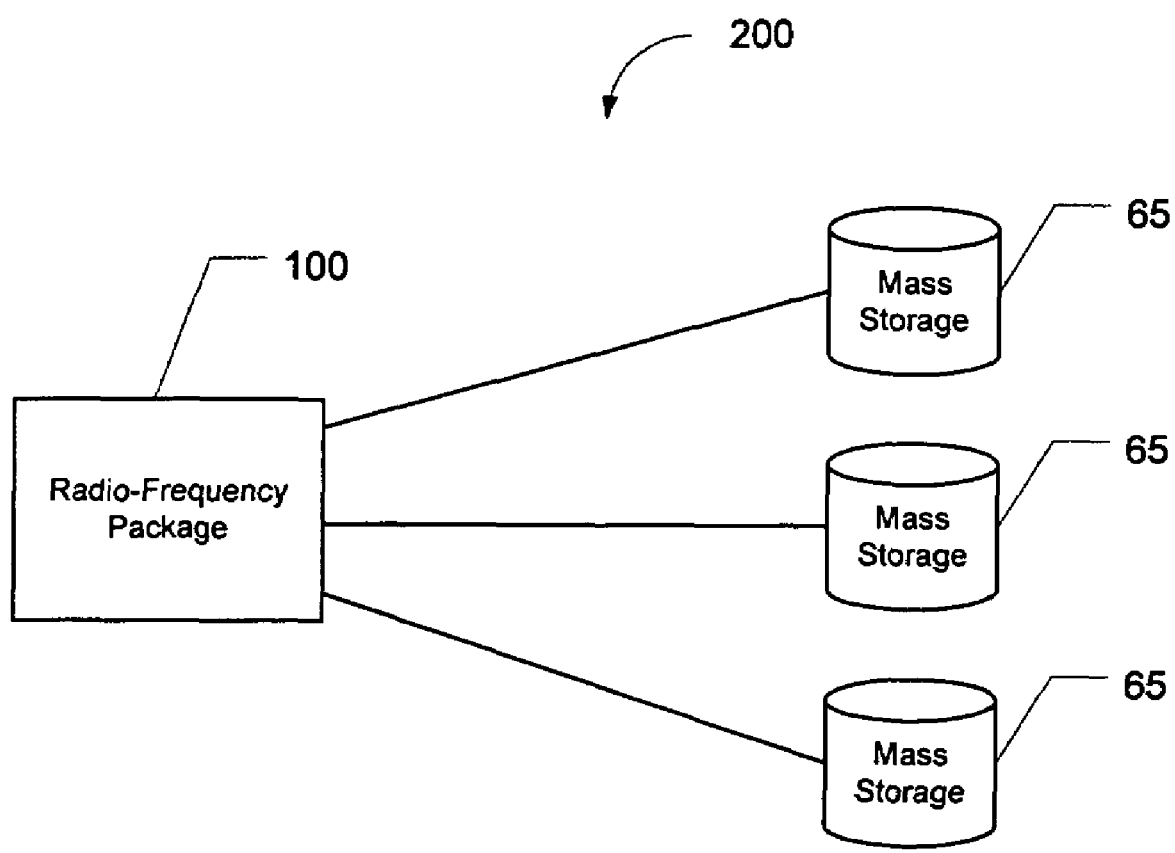
FIG. 10 illustrates a system according to one embodiment.

Turning now to FIG. 10, illustrated is an embodiment of a system 200. As shown, system 200 may comprise a microelectronic package 100 and one or more mass storage devices 65 coupled to microelectronic package 100. Microelectronic package 100 may comprise a die having one or more through-vias, each filled with a solder material. Microelectronic package 100 may also comprise a substrate electrically connected to a backside of a die by one or more solder bumps disposed between die and substrate. A microelectronic device may be disposed on a frontside of die and electrically coupled to solder material of one or more through-vias of die.

Mass storage device 65 and microelectronic package 100 (except for the teachings of embodiments of the invention incorporated therein) represent a broad range of elements. For example, mass storage device 65 may be an optical storage, a magnetic storage, such as a disk drive, and so forth. Further, system 200 may be embodied in a broad range of form factors for a broad range of general or special purpose applications including, for example, a wireless adaptor, a wireless mobile phone, a set-top box, a personal digital assistant, a tablet computing device, a desktop computing device, and/or an entertainment control unit. System 200 may be endowed with various operating systems and/or applications to solve various computing problems.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

The invention claimed is:

1. An apparatus, comprising:
   a die having one or more through-vias, each filled with a solder material;
   a substrate; and
   one or more solder bumps disposed between and electrically connecting the substrate and a backside of the die, wherein a portion of the through via is disposed directly on the solder bump, and wherein a portion of the solder bump is in direct contact with the backside of the die.

2. The apparatus of claim 1, wherein the substrate has one or more copper bumps disposed thereon and wherein one or more of the solder bumps are electrically coupled to one or more of the one or more copper bumps of the substrate.

3. The apparatus of claim 1, further comprising an underfill material disposed between the substrate and the backside of the die.

4. The apparatus of claim 1, further comprising a microelectronic device disposed on a frontside of the die and electrically coupled to the solder material of one or more of the through-vias.

5. The apparatus of claim 4, wherein the microelectronic device comprises a selected one of a radio-frequency device, a logic device, and a memory device.

6. The apparatus of claim 4, wherein the microelectronic device is wire-bonded to at least one of the die and the substrate.

7. The apparatus of claim 1, further comprising a molding material encapsulating the die.

8. A system, comprising:
   a microelectronic package, having:
      a die having one or more through-vias, each filled with a solder material;
      a substrate; and
      one or more solder bumps disposed between and electrically connecting the substrate and a backside of the die, wherein a portion of the through via is disposed directly on the solder bump. and wherein a portion of the solder bump is in direct contact with the backside of the die; and
   one or more mass storage devices coupled to the microelectronic package.

9. The system of claim 8, wherein the solder bump is coupled to a copper bump disposed on the substrate.

10. The system of claim 8, wherein the microelectronic package further has an underfill material disposed between the substrate and the backside of the die.

11. The system of claim 8, wherein the microelectronic package further comprises a microelectronic device disposed on a frontside of the die and electrically coupled to the solder material of one or more of the through-vias.

12. The system of claim 11, wherein the microelectronic device comprises a selected one of a radio-frequency device, a logic device, and a memory device.

13. The system of claim 8, wherein the die is encapsulated by a molding material.

14. The system of claim 8, wherein the system comprises a selected one of a wireless adaptor, a wireless mobile phone, a set-top box, a personal digital assistant, a tablet computing device, a laptop computing device, a desktop computing device, and an entertainment control unit.

* * * * *

UNITED STATES PATENT AND TRADEMARK OFFICE
CERTIFICATE OF CORRECTION

PATENT NO. : 7,638,867 B2  Page 1 of 1
APPLICATION NO. : 11/446305
DATED : December 29, 2009
INVENTOR(S) : Xu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 135 days.

Signed and Sealed this

Twenty-first Day of December, 2010

David J. Kappos
*Director of the United States Patent and Trademark Office*